US012692415B2

(12) United States Patent
Sakai

(10) Patent No.: US 12,692,415 B2
(45) Date of Patent: Jul. 28, 2026

(54) POLISHING LIQUID FOR POLISHING COMPOUND SEMICONDUCTOR SUBSTRATE

(71) Applicant: DISCO CORPORATION, Tokyo (JP)

(72) Inventor: Ayumu Sakai, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 388 days.

(21) Appl. No.: 18/298,761

(22) Filed: Apr. 11, 2023

(65) Prior Publication Data

US 2023/0357601 A1 Nov. 9, 2023

(30) Foreign Application Priority Data

May 9, 2022 (JP) ................................. 2022-077190

(51) Int. Cl.
| | |
|---|---|
| *C09G 1/04* | (2006.01) |
| *B24B 1/00* | (2006.01) |
| *B24B 37/04* | (2012.01) |
| *C09G 1/00* | (2006.01) |
| *H10P 52/40* | (2026.01) |

(52) U.S. Cl.
CPC .................. *C09G 1/04* (2013.01); *B24B 1/00* (2013.01); *B24B 37/044* (2013.01); *C09G 1/00* (2013.01); *H10P 52/402* (2026.01); *H10P 52/403* (2026.01)

(58) Field of Classification Search
None
See application file for complete search history.

(56) References Cited

U.S. PATENT DOCUMENTS

| | | | | |
|---|---|---|---|---|
| 2008/0153292 | A1* | 6/2008 | White | C09G 1/02 |
| | | | | 438/692 |
| 2016/0130475 | A1 | 5/2016 | Kojima et al. | |
| 2019/0010359 | A1* | 1/2019 | Matsuyama | C09G 1/02 |
| 2019/0311910 | A1 | 10/2019 | Kojima et al. | |
| 2020/0109313 | A1 | 4/2020 | Ito et al. | |
| 2020/0332163 | A1 | 10/2020 | Matsuo et al. | |

(Continued)

FOREIGN PATENT DOCUMENTS

| | | |
|---|---|---|
| CN | 114410226 A | 4/2022 |
| JP | 2012253259 A | 12/2012 |
| WO | 2017138308 A1 | 8/2017 |

(Continued)

OTHER PUBLICATIONS

Office action issued in counterpart Singapore patent application No. 10202300964V, dated Mar. 8, 2024.

(Continued)

*Primary Examiner* — Jiong-Ping Lu
(74) *Attorney, Agent, or Firm* — Greer Burns & Crain Ltd.

(57) ABSTRACT

A polishing liquid for polishing a compound semiconductor substrate includes an aqueous solution in which a permanganate and a water-soluble compound are dissolved. The water-soluble compound is obtained by combination of a strong acid and a transition metal element. The transition metal element includes at least one element of Group III elements, lanthanoid, or Group IV elements. Concentrations of ammonium ions and ammonia contained in the aqueous solution are equal to or less than concentrations of the Group III elements, the lanthanoid, and the Group IV elements.

9 Claims, 3 Drawing Sheets

(56)                    References Cited

U.S. PATENT DOCUMENTS

| | | | |
|---|---|---|---|
| 2021/0238448 A1 | 8/2021 | Singh et al. | |
| 2025/0197675 A1* | 6/2025 | Nakagai ................. | B24B 37/00 |

FOREIGN PATENT DOCUMENTS

| | | |
|---|---|---|
| WO | 2017212971 A1 | 12/2017 |
| WO | 2018174008 A1 | 9/2018 |
| WO | 2023189512 A1 | 10/2023 |

OTHER PUBLICATIONS

1 Office Action issued in counterpart Japanese patent application No. 2022-077190, dated Jan. 6, 2026.
Decision to Grant Patent issued in Japanese patent application No. 2022-077190, dated May 26, 2026.

\* cited by examiner

POLISHING LIQUID FOR POLISHING COMPOUND SEMICONDUCTOR SUBSTRATE

BACKGROUND OF THE INVENTION

Field of the Invention

The present invention relates to a polishing liquid for polishing a compound semiconductor substrate, and to a polishing method for a compound semiconductor substrate.

Description of the Related Art

In recent years, attention has been paid to power devices that are capable of controlling a high current and are higher in voltage resistance as compared to conventional devices formed by use of a silicon single crystal substrate. The power devices are formed, for example, on one surface side of a silicon carbide (SiC) single crystal substrate. It is known to subject the one surface side to chemical mechanical polishing (CMP) before forming the devices on the one surface side of the SiC single crystal substrate (refer to, for example, Japanese Patent Laid-open No. 2012-253259). In the polishing method described in Japanese Patent Laid-open No. 2012-253259, in a state in which the SiC single crystal substrate is held under suction by a chuck table, the SiC single crystal substrate is polished while supplying a polishing liquid to a position between a fixed abrasive grain pad and the SiC single crystal substrate.

Japanese Patent Laid-open No. 2012-253259 describes particularly that the polishing rate can be set to a highest value by using potassium permanganate ($KMnO_4$) and ammonium cerium nitrate (($NH_4$)$_2$Ce($NO_3$)$_6$) in a polishing liquid. For example, Japanese Patent Laid-open No. 2012-253259 describes that a polishing rate of 197 nm/min could be achieved in a case where a rotating speed of a polishing pad (namely, a rotating speed of a spindle) was set to 495 rpm, a rotating speed of a chuck table was set to 500 rpm, a pressure on the chuck table from a polishing pad was set to 1 kgf/cm$^2$, and a flow rate of a polishing liquid containing 3% of potassium permanganate and 0.16% of ammonium cerium nitrate was set to 0.15 L/min. In regard of the polishing rate, 197 nm/min corresponds to 11.82 μm/h. Besides, in regard of the pressure, 1 kgf/cm$^2$ corresponds to approximately 98 kPa.

While the above-mentioned polishing has conventionally been performed on an SiC single crystal substrate having a diameter of four inches (approximately 100 mm), in a polishing apparatus for polishing a substrate having a diameter in excess of four inches, there are cases where a pressure in excess of 50 kPa cannot be applied to the SiC single crystal substrate from the viewpoint of the performance of the polishing apparatus. While the polishing rate increases according to the pressure in polishing that conforms to Preston's law, it is desired to realize a high polishing rate in excess of the polishing rate in the related art, even if the pressure applied to the SiC single crystal substrate is lowered as compared to the related art.

SUMMARY OF THE INVENTION

The present invention has been made in consideration of the above-mentioned problem. It is an object of the present invention to realize a polishing rate higher than that in the related art by improving a polishing liquid.

In accordance with an aspect of the present invention, there is provided a polishing liquid for polishing a compound semiconductor substrate, including an aqueous solution in which a permanganate and a water-soluble compound obtained by combination of a strong acid and a transition metal element are dissolved, in which the transition metal element includes at least one element of Group III elements, lanthanoid, or Group IV elements, and concentrations of ammonium ions and ammonia contained in the aqueous solution are equal to or less than concentrations of the Group III elements, the lanthanoid, and the Group IV elements.

Preferably, a concentration of the permanganate is equal to or more than 0.6 wt %, and a concentration of the water-soluble compound is equal to or more 0.3 wt %.

Besides, preferably, a concentration of the permanganate is equal to or less than 4.8 wt %, and a concentration of the water-soluble compound is equal to or less than 2.4 wt %.

In accordance with another aspect of the present invention, there is provided a polishing method for a compound semiconductor substrate for polishing the compound semiconductor substrate, including a holding step of holding the compound semiconductor substrate by a chuck table of a polishing apparatus, and a polishing step of polishing the compound semiconductor substrate while supplying a polishing liquid from a polishing pad to the compound semiconductor substrate in a state in which the polishing pad, having abrasive grains, is brought into contact with one surface of the compound semiconductor substrate. The polishing liquid includes an aqueous solution in which a permanganate and a water-soluble compound obtained by combination of a strong acid and a transition metal element are dissolved. The transition metal element includes at least one element of Group III elements, lanthanoid, or Group IV elements. Concentrations of ammonium ions and ammonia contained in the aqueous solution are equal to or less than concentrations of the Group III elements, the lanthanoid, and the Group IV elements.

The polishing liquid according to one aspect of the present invention includes the aqueous solution in which a permanganate and a water-soluble compound obtained by combination of a strong acid and a transition metal element are dissolved. The transition metal element includes at least one element of Group III elements, lanthanoid, or Group IV elements. Particularly, the concentrations of ammonium ions and ammonia contained in the polishing liquid are equal to or less than the concentrations of the Group III elements, the lanthanoid, and the Group IV elements. Therefore, the oxidizing action on the one surface of the compound semiconductor substrate by the permanganate ions can be kept higher than that in a case where the concentrations of the ammonium ions and ammonia exceed these concentrations. When the one surface side of the compound semiconductor substrate is oxidized, the oxidized one surface side can be ground off by the polishing pad more smoothly as compared to the case where the one surface side is not oxidized. In this way, by lowering the concentrations of ammonium ions and ammonia, it is possible to realize a higher polishing rate as compared to the case of using potassium permanganate and ammonium cerium nitrate in the polishing liquid.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

An embodiment according to one aspect of the present invention will be described with reference to the drawings. First, a polishing liquid 1 (see FIG. 1) of the present embodiment will be described. The polishing liquid 1 includes an aqueous solution in which a permanganate and a water-soluble compound are dissolved. As the permanganate, sodium permanganate ($NaMnO_4$), potassium permanganate ($KMnO_4$), or the like is used. Note that, as described later, it is preferable to use sodium permanganate which is higher in solubility in water than potassium permanganate. In addition, the permanganate may be a permanganate containing a metallic cation, such as silver permanganate ($AgMnO_4$), zinc permanganate ($Zn(MnO_4)_2$), magnesium permanganate ($Mg(MnO_4)_2$), calcium permanganate (Ca $(MnO_4)_2$), and barium permanganate ($Ba(MnO_4)_2$).

As the water-soluble compound, (i) a water-soluble compound obtained by combination of a strong acid and a Group III element, (ii) a water-soluble compound obtained by combination of a strong acid and a lanthanoid, or (iii) a water-soluble compound obtained by combination of a strong acid and a Group IV element may be used. Examples of the strong acid may include nitric acid ($HNO_3$), hydrochloric acid ($HCl$), and sulfuric acid ($H_2SO_3$), but the strong acid is not limited to these three. (1) The Group III element may include, for example, yttrium (Y), (2) the lanthanoid may include, for example, lanthanum (La) and cerium (Ce), and (3) the Group IV element may includes, for example, zirconium.

In a case where nitric acid ($HNO_3$) is used as the strong acid, each of (1) yttrium nitrate ($Y(NO_3)_3$), (2) lanthanum nitrate ($La(NO_3)_3$), cerium nitrate ($Ce(NO_3)_3$), and (3) zirconyl nitrate (also called zirconium oxynitrate) ($ZrO(NO_3)_2$) is used as the water-soluble compound.

In a case where hydrochloric acid ($HCl$) is used as the strong acid, each of (1) yttrium chloride ($YCl_3$), (2) lanthanum chloride ($LaCl_3$), cerium chloride ($CeCl_3$), and (3) zirconyl chloride (also called zirconium oxychloride) ($ZrOCl_2$) is used as the water-soluble compound.

In a case where sulfuric acid ($H_2SO_4$) is used as the strong acid, each of (1) yttrium sulfate ($Y_2(SO_4)_3$), (2) lanthanum sulfate ($La_2(SO_4)_3$), cerium sulfate ($Ce(SO_4)_2$), and (3) zirconyl sulfate (also called zirconium sulfate) ($ZrOSO_4$) is used as the water-soluble compound.

Figure 1:
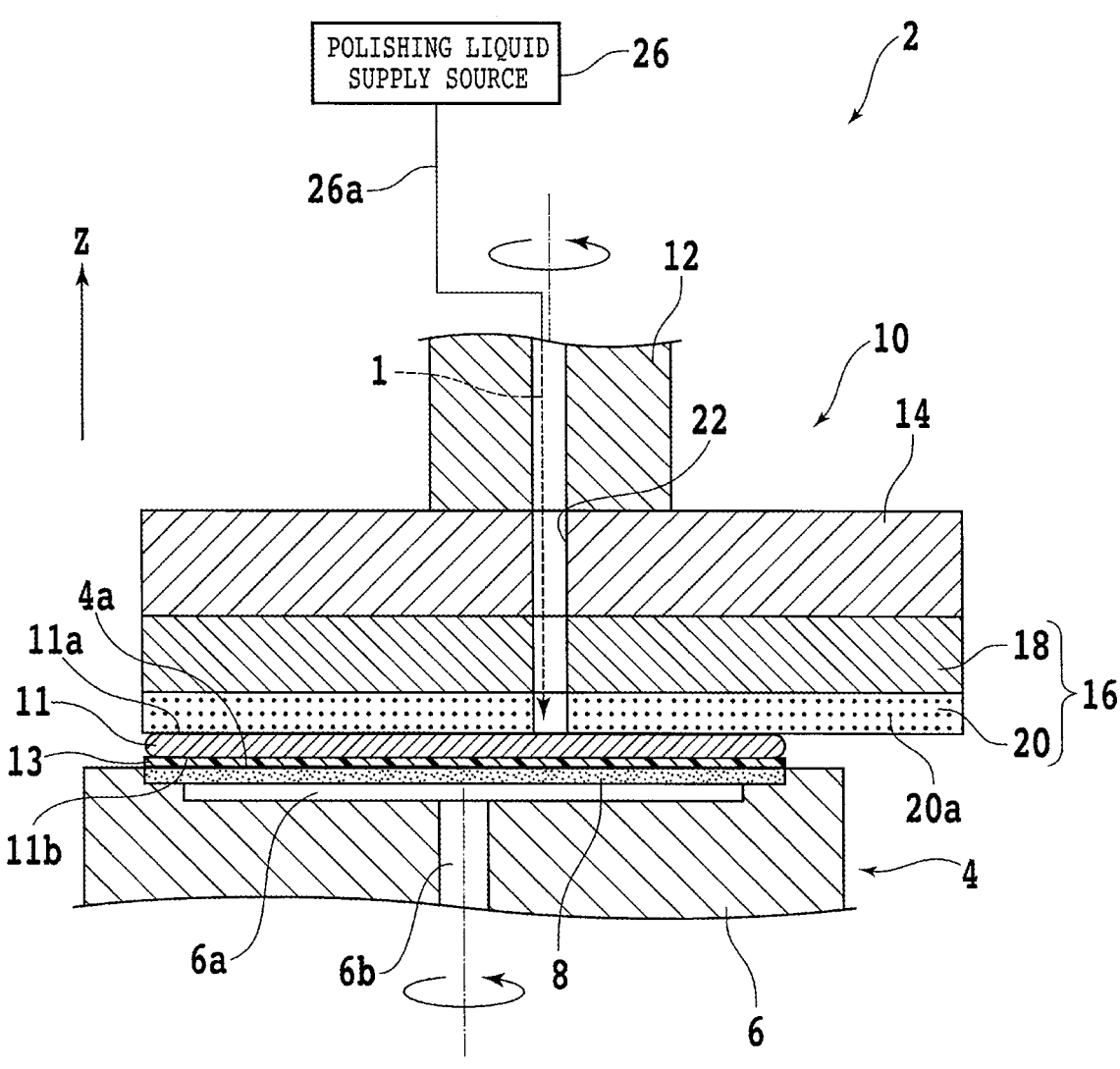
FIG. 1 is a partially sectional side view of a polishing apparatus.

The polishing liquid 1 including the aqueous solution in which the permanganate and the water-soluble compound are dissolved is strongly acidic (for example, pH is a predetermined value less than three), and, as depicted in FIG. 1, is used when a compound semiconductor substrate (workpiece) 11 is polished. In other words, the polishing liquid 1 is for polishing a compound semiconductor substrate. The compound semiconductor substrate 11 is, for example, a single crystal substrate of silicon carbide (SiC), but it may be a single crystal substrate of other compound semiconductors such as gallium nitride (GaN) and gallium arsenide (GaAs).

Particularly, the polishing liquid 1 is strongly acidic, and is used when a compound semiconductor is polished. Meanwhile, the silicon single crystal substrate is generally polished under a basic condition, so that the polishing liquid 1 is normally not used for polishing of the silicon single crystal substrate. Note that the polishing liquid 1 may further include such additives as a pH adjustor, a viscosity adjustor, a rust-preventive agent, or a preservative, and free abrasive grains (for example, abrasive grains made of silica ($SiO_2$)), in addition to the above-mentioned aqueous solution in which the permanganate and the water-soluble compound are dissolved.

Next, the mechanism of chemical mechanical polishing applied to the SiC single crystal substrate which is the compound semiconductor substrate 11 by use of the polishing liquid 1 including the aqueous solution in which sodium permanganate ($NaMnO_4$) and lanthanum nitrate ($La(NO_3)_3$) are dissolved will be described. Note that the mechanism described below is an assumption by the present applicant, and the actual mechanism may be different from the following mechanism. First, when the polishing liquid 1 is supplied to one surface 11a (see FIG. 1) of the compound semiconductor substrate 11, Si atoms on the one surface 11a side are oxidized by the oxidizing action of permanganic acid (namely, an oxidizer), whereby silicon oxide ($SiO_2$) layer is formed. Note that C atoms of the SiC single crystal substrate are changed into carboxyl groups, carbon dioxide, or the like. The carboxyl group(s) on the compound semiconductor substrate 11 is(are) coordinated to $La^{3+}$ or abrasive grains in the polishing liquid 1, and then the carboxyl group(s) is(are) extracted from the compound semiconductor substrate 11 to the polishing liquid 1. In addition, carbon dioxide may be dissolved in the polishing liquid 1 as carbonic acid ions, or may become gas to be discharged from the polishing liquid 1 to the exterior.

The $SiO_2$ layer formed on the one surface 11a side is softer than a crystal plane of SiC. The $SiO_2$ layer is physically ground by the abrasive grains, and as a result, a new SiC crystal plane appears to be exposed. From this time, the formation of the $SiO_2$ layer by oxidation and the physical grinding of the $SiO_2$ layer by the abrasive grains are alternately repeated. Thus, in order to cause polishing on the one surface 11a side to progress by use of the polishing liquid 1, an ability to oxidize the one surface 11a of the compound semiconductor substrate 11 needs to sufficiently be exercised in the polishing liquid 1.

In the present embodiment, mainly, the one surface 11a side is oxidized by permanganic acid. The permanganic acid is stronger in oxidizing power when pH is low (namely, under an acidic condition) than when pH is high (namely, under a neutral or a basic condition). In the present embodiment, the polishing liquid 1 is maintained in a strongly acidic state by use of the water-soluble compound obtained by combination of a strong acid and a transition metal element, so that the oxidizing ability of permanganic acid can sufficiently be exercised.

In contrast, in the case of using an aqueous solution in which potassium permanganate and ammonium cerium nitrate are dissolved as in the related art, it is considered that permanganic acid in the polishing liquid 1 is consumed through oxidation of ammonium ions ($NH^{4+}$) and ammonia ($NH_3$) by permanganic acid. Hence, it is considered that the amount of permanganic acid for oxidizing the one surface 11a side is reduced, and the oxidizing ability of permanganic acid is relatively weakened. It is considered that when it becomes difficult for the oxidation on the one surface 11a side to progress, grinding by the abrasive grains becomes difficult, resulting in a lowering in polishing rate.

Meanwhile, the water-soluble compound in the present embodiment does not contain ammonium ions nor ammonia (in other words, the concentrations of ammonium ions and ammonia are substantially 0 wt %), as above-mentioned. Hence, as compared to the conventional polishing liquid containing potassium permanganate and ammonium cerium nitrate, the concentrations of ammonium ions and ammonia contained in the polishing liquid 1 are equal to or less than the concentrations of Group III elements, lanthanoid, and group IV elements. For example, in the polishing liquid 1 in the present embodiment, the concentration of ammonium ions is equal to or less than a quantitation limit by ion chromatography, and is substantially 0 wt %.

It is to be noted, however, that ammonium ions present in a clean room in which polishing is conducted may be dissolved in a trace amount in the polishing liquid 1, so that the concentration of ammonium ions in the polishing liquid 1 may not be perfectly 0 wt %. However, a basic substance and basic ions such as ammonia and ammonium ions are not intentionally added as raw material at the time of producing the polishing liquid 1 in the present embodiment. In the polishing liquid 1, therefore, the oxidizing ability of permanganic acid can sufficiently be exercised, as compared to the conventional polishing liquid.

Next, a polishing method for the compound semiconductor substrate 11 by use of the polishing liquid 1 will be described. First, a polishing apparatus 2 to be used will be described. FIG. 1 is a partially sectional side view of the polishing apparatus 2. Note that a Z-axis direction depicted in FIG. 1 is substantially parallel to a vertical direction. The polishing apparatus 2 has a disc-shaped chuck table 4. To the lower surface side of the chuck table 4, a rotary shaft (not illustrated) with its longitudinal axis disposed along the Z-axis direction is coupled. The rotary shaft is provided with a driven pulley (not illustrated).

In the vicinity of the chuck table 4, there is provided a rotational drive source (not illustrated) such as a motor. An output shaft of the rotational drive source is provided with a driving pulley (not illustrated). An endless belt (not illustrated) is wrapped around the driving pulley and the driven pulley, and the motive power of the rotational drive source is transmitted to the rotary shaft of the chuck table. When the rotational drive source is operated, the chuck table 4 is rotated around the rotary shaft. The chuck table 4, the rotational drive source, and the like are supported by a moving plate (not illustrated) which is movable along a predetermined direction (for example, an X-axis direction orthogonal to the Z-axis direction).

The moving plate is movable along the X-axis direction, together with the chuck table 4, the rotational drive source, and the like, by a ball screw type moving mechanism (not illustrated). The chuck table 4 has a disc-shaped frame body 6 formed by a ceramic. A disc-shaped recess is formed in an upper part of the frame body 6. A disc-shaped porous plate 8 formed by a porous ceramic or the like is fixed to the recess. An upper surface of the porous plate 8 and an upper surface of the frame body 6 are flush with each other to form a substantially flat holding surface 4a.

The porous plate 8 is connected to a suction source (not illustrated) such as a vacuum pump through passages 6a and 6b formed inside the frame body 6. When the suction source is operated, a negative pressure is transmitted to the upper surface of the porous plate 8. The compound semiconductor substrate 11 is placed on the holding surface 4a. A circular protective tape 13 formed by a resin is adhered to the other surface 11b of the compound semiconductor substrate 11 depicted in FIG. 1 for the purpose of preventing contamination, shock, and the like.

The other surface 11b side of the compound semiconductor substrate 11 is held under suction on the holding surface 4a, with the protective tape 13 therebetween, such that the one surface 11a located on the side opposite to the other surface 11b is directed upward. A polishing unit 10 is disposed on the upper side of the holding surface 4a. The polishing unit 10 has a cylindrical spindle housing (not illustrated). The longitudinal direction of the spindle housing is disposed substantially in parallel to the Z-axis direction. A ball screw type Z-axis direction moving unit (not illustrated) for moving the polishing unit 10 along the Z-axis direction is coupled to the spindle housing.

Part of a cylindrical spindle 12 is rotatably accommodated in the spindle housing. The longitudinal direction of the spindle 12 is disposed substantially in parallel to the Z-axis direction. A rotational drive source (not illustrated) such as a motor for rotating the spindle 12 is provided at part on the upper side of the spindle 12. A central portion of an upper surface of a disc-shaped mount 14 is coupled to a lower end part of the spindle 12. The mount 14 has a diameter larger than a diameter of the holding surface 4a. A disc-shaped polishing tool 16 substantially the same as the mount 14 in diameter is mounted to a lower surface of the mount 14.

The polishing tool 16 has a disc-shaped base (also called platen) 18 coupled to the lower surface of the mount 14. The base 18 is formed by metal such as stainless steel. A polishing pad 20 substantially the same as the base 18 in diameter is fixed to a lower surface of the base 18. The polishing pad 20 has a main body part formed by a rigid foamed urethane resin. Abrasive grains 20a made of silica are fixed in the main body part. In other words, the polishing pad 20 is a generally-called fixed abrasive grain pad. Note that, while the abrasive grains 20a are drawn regularly in the polishing pad 20 in FIG. 1, in practice, the abrasive grains 20a are disposed at random in the polishing pad 20.

Incidentally, in the polishing pad 20, in place of the rigid foamed urethane resin, another rigid foamed resin or a nonwoven fabric may be used. In addition, the abrasive grains 20a may not be fixed in the polishing pad 20. In this case, free abrasive grains are dispersed in the polishing liquid 1. Radially central positions of the polishing pad 20, the base 18, the mount 14, and the spindle 12 are substantially coincident with one another, and a cylindrical through-hole 22 is formed so as to pass these central positions. An upper end part of the through-hole 22 is connected to a polishing liquid supply source 26 through a conduit 26a. The polishing liquid supply source 26 includes a storage tank (not illustrated) for the polishing liquid 1, a pump (not illustrated) for feeding the polishing liquid 1 from the storage tank to the conduit 26a, and the like. The polishing liquid 1 supplied from the polishing liquid supply source 26 is supplied through the through-hole 22 to a central portion of the polishing pad 20.

Figure 2:
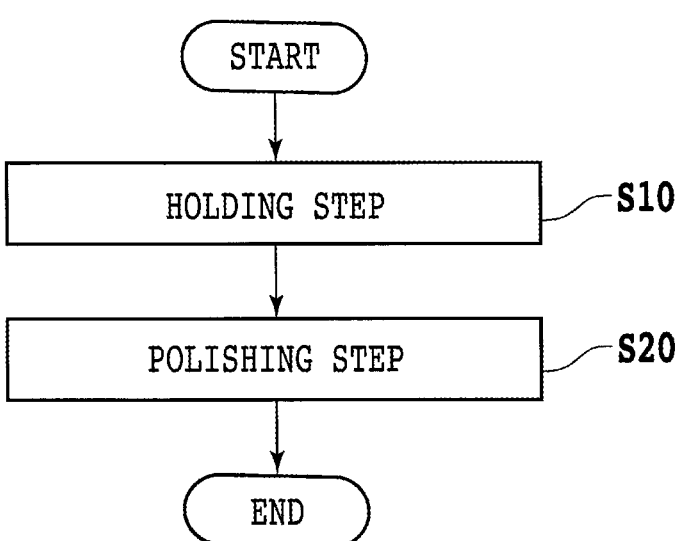
FIG. 2 is a flow chart of a polishing method according to an embodiment of the present invention.

FIG. 2 is a flow chart of the polishing method when the compound semiconductor substrate 11 is polished. Note that the compound semiconductor substrate 11 in the present embodiment is an SiC single crystal substrate having a diameter of six inches (approximately 150 mm). At the time of polishing the one surface 11a, first, one compound semiconductor substrate 11 is placed on the chuck table 4 such that the one surface 11a is exposed to the upper side. Then, the other surface 11b of the compound semiconductor substrate 11 is held under suction on the holding surface 4a (holding step S10). While the one surface 11a is an Si surface and the other surface 11*b* is a C surface in the present embodiment, the one surface 11*a* may be a C surface and the other surface 11*b* may be an Si surface.

Next, a polishing step S20 is conducted. In the polishing step S20, the chuck table 4 is rotated in a predetermined direction, and the spindle 12 is also rotated in a predetermined direction. The rotating speed of the chuck table 4 is set to, for example, 750 rpm, and that of the spindle 12 (namely, the polishing tool 16) is set to, for example, 745 rpm. Thus, a speed difference is set such that the rotating speed of one of the chuck table 4 and the spindle 12 is an even number, whereas the rotating speed of the other is an odd number, so that the same regions of the one surface 11*a* and the polishing pad 20 can be prevented from keep contacting with each other for a predetermined period of time. On the other hand, if the rotating speeds of the chuck table 4 and the spindle 12 are the same, the same regions of the one surface 11*a* and the polishing pad 20 keep contacting with each other for a predetermined period of time.

In addition, in the present embodiment, the to-be-ground surface (the one surface 11*a*) is directed upward (in other words, face-up), and the polishing liquid 1 is supplied to the to-be-ground surface from above the to-be-ground surface, so that the polishing liquid 1 can be suitably supplied to the to-be-ground surface even when the rotating speed of the chuck table 4 exceeds 120 rpm. On the other hand, in a case where the to-be-ground surface is directed downward (in other words, face-down), the compound semiconductor substrate 11 is disposed at the position of the polishing pad 20 depicted in FIG. 1, and the polishing pad 20 is disposed at the position of the chuck table 4 depicted in FIG. 1, and the polishing liquid 1 is supplied to that predetermined region of the polishing pad 20 which is out of contact with the compound semiconductor substrate 11 from above.

However, in a case where the to-be-ground surface is thus directed downward (in other words, face-down), when the rotating speed of the polishing pad 20 exceeds 120 rpm, the polishing liquid 1 supplied to the polishing pad 20 would be scattered to the exterior of the polishing pad 20 by a centrifugal force, so that the polishing liquid 1 is not suitably supplied to the to-be-ground surface. As a result, it is difficult for the polishing rate to be increased even if the rotating speed of the polishing pad 20 is raised (in other words, the polishing does not conform to Preston's law). In the present embodiment, the face-up system is adopted, so that the polishing liquid 1 can suitably be supplied to the to-be-ground surface even if a high-speed rotation in excess of 120 rpm is conducted. In addition, the polishing rate can be increased as the rotating speeds of the chuck table 4 and the spindle 12 are raised. In other words, polishing conforming to Preston's law can be realized.

The flow rate of the polishing liquid 1 is 0.1 L/min to 0.3 L/min (for example, 0.2 L/min). In addition, the pressure with which the polishing pad 20 presses the compound semiconductor substrate 11 is 30 kPa to 50 kPa (for example, 40 kPa). However, since the polishing in the present embodiment conforms to Preston's law, the pressure may appropriately be raised or lowered according to the mode of polishing. It is to be noted that, however, from the viewpoint of performance of the polishing apparatus 2, the pressure is set to be equal to or less than 50 kPa, more preferably, equal to or less than 40 kPa.

In the polishing step S20, in a state in which the polishing pad 20 is brought into contact with the one surface 11*a*, the compound semiconductor substrate 11 is polished while rotating the chuck table 4 and the spindle 12 and supplying the polishing liquid 1 from the polishing pad 20 to the compound semiconductor substrate 11. At this time, the one surface 11*a* side is polished according to the above-described mechanism of chemical mechanical polishing. Note that, in the polishing step S20, the chuck table 4 may be moved in the X-axis direction in the range of a predetermined distance by the X-axis direction moving mechanism. In other words, in the polishing step S20, an operation of moving the chuck table 4 by a predetermined distance in the +X direction and then moving the chuck table 4 by a predetermined distance in the −X direction may be repeated.

The predetermined distance is smaller than a radius of the compound semiconductor substrate 11, preferably smaller than 1/10 times the diameter of the compound semiconductor substrate 11. In the present embodiment in which the diameter of the compound semiconductor substrate 11 is six inches (approximately 150 mm), the predetermined distance is set to be 10 mm. When the chuck table 4 is thus oscillated in the polishing step S20, there is an advantage that the one surface 11*a* side can be polished more evenly (for example, total thickness variation (TTV) can be more lowered) as compared to the case where the oscillation is not conducted.

First Experiment

Figure 3:
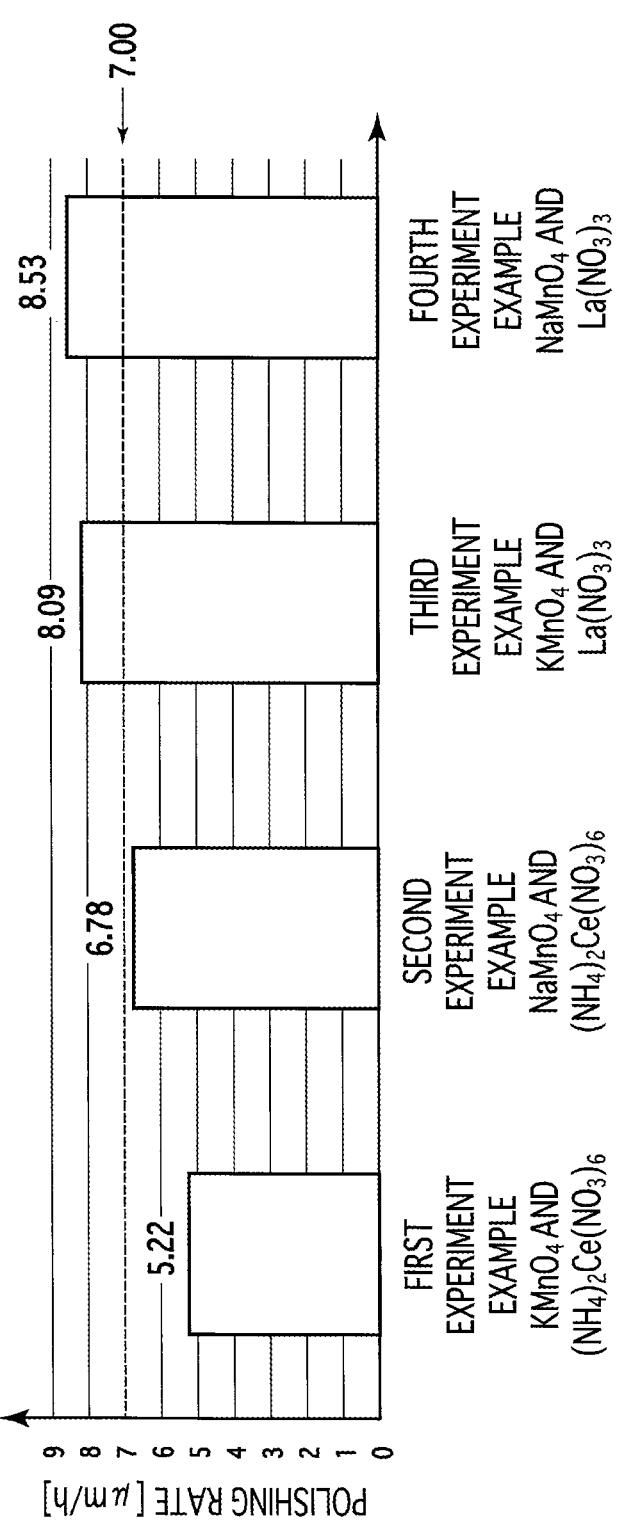
FIG. 3 is a diagram depicting results of an experiment in which polishing liquids according to the related art and polishing liquids according to the embodiment of the present invention were compared with each other.

Next, a first experiment will be described with reference to FIG. 3. FIG. 3 is a diagram depicting results of an experiment of comparison between polishing rates concerning conventional polishing liquids (First and Second Experiment Examples) and the polishing rates concerning the polishing liquids 1 of the present embodiment (Third and Fourth Experiment Examples). In the First to Fourth Experiment Examples of FIG. 3, a polishing pad 20 of the fixed abrasive grain system in which silica abrasive grains made by Admatechs co., ltd. (product name: SO-E2, grain size 0.4 μm to 0.6 μm) are fixed in a pad formed by a rigid foamed urethane resin was used. In addition, the polishing conditions were set as described below.

Rotating speed of chuck table 4: 750 rpm
Rotating speed of polishing pad 20: 745 rpm
Flow rate of polishing liquid: 0.2 L/min
Pressure from polishing pad 20: 39.2 kPa
Polishing time: 620 s
Compound semiconductor substrate 11: SiC single crystal substrate
Diameter of compound semiconductor substrate 11: six inches (approximately 150 mm)
To-be-Polished Surface: Si Surface In First Experiment Example (conventional example), 60 g of ammonium cerium nitrate was added to a sufficient amount of pure water, 120 g of potassium permanganate was further added to this, this was subsequently diluted with pure water to obtain a total amount of 10 L, and then stirring with a stirrer was conducted at 100 rpm for 30 minutes, whereby 10 L of a polishing liquid was prepared in which 1.2 wt % of potassium permanganate and 0.6 wt % of ammonium cerium nitrate were dissolved.

In Second Experiment Example (conventional example), 60 g of ammonium cerium nitrate was added to a sufficient amount of pure water, 120 g of sodium permanganate was further added to this, this was subsequently diluted with pure water to obtain a total amount of 10 L, and then stirring with a stirrer was conducted at 100 rpm for 30 minutes, whereby 10 L of a polishing liquid was prepared in which 1.2 wt % of sodium permanganate and 0.6 wt % of ammonium cerium nitrate were dissolved.

In Third Experiment Example (one example of the present embodiment), 79.94 g of lanthanum(III) nitrate hexahydrate was added to a sufficient amount of pure water, 120 g of potassium permanganate was further added to this, this was subsequently diluted with pure water to obtain a total amount of 10 L, and then stirring with a stirrer was conducted at 100 rpm for 30 minutes, whereby 10 L of a polishing liquid 1 was prepared in which 1.2 wt % of potassium permanganate and 0.6 wt % of lanthanum nitrate were dissolved.

In Fourth Experiment Example (another example of the present embodiment), 79.94 g of lanthanum(III) nitrate hexahydrate was added to a sufficient amount of pure water, 120 g of sodium permanganate was further added to this, this was subsequently diluted with pure water to obtain a total amount of 10 L, and then stirring with a stirrer was conducted at 100 rpm for 30 minutes, whereby 10 L of a polishing liquid 1 was prepared in which 1.2 wt % of sodium permanganate and 0.6 wt % of lanthanum nitrate were dissolved.

Note that, in First to Fourth Experiment Examples, the polishing pad 20 of the fixed abrasive grain system was used, and free abrasive grains were not contained in the polishing liquids. Thus, each concentration means wt % in the polishing liquid that does not contain abrasive grains.

In First to Fourth Experiment Examples, the Si surface side of an SiC single crystal substrate was polished according to the above-described polishing conditions. The polishing rate in First Experiment Example was 5.22 μm/h, and the polishing rate in Second Experiment Example was 6.78 μm/h. In this way, in First and Second Experiment Examples in which the conventional polishing liquids were used, a target polishing rate of 7.00 μm/h was not achieved. In contrast, the polishing rate in Third Experiment Example was 8.09 μm/h, and the polishing rate in Fourth Experiment Example was 8.53 μm/h, so that they exceed the target polishing rate of 7.00 μm/h.

It is considered that, by lowering the concentrations of ammonium ions and ammonia as described above, it was possible to realize a higher polishing rate, as compared to the case of using potassium permanganate and ammonium cerium nitrate in the polishing liquid as in the aforementioned related art. In addition, the reason that the polishing rate was enhanced in the case of using sodium permanganate as compared to the case of using potassium permanganate is considered to be attributable to the fact that the solubility of sodium permanganate is higher than the solubility of potassium permanganate.

For example, the solubility of sodium permanganate in 100 g of pure water at 25° C. is 61.6 g, whereas the solubility of potassium permanganate in 100 g of pure water at 25° C. is 7.5 g. It is presumed that, since the amount of permanganic acid increases as the solubility is higher, and the SiC single crystal substrate is more liable to be oxidized as the amount of permanganic acid increases, leading to an increase in the polishing rate. Note that this is an assumption by the present applicant, and the increase in the polishing rate may be due to other factors.

Second Experiment

Next, results of an experiment in which the SiC single crystal substrate as the compound semiconductor substrate 11 was polished by use of the polishing liquid 1 including an aqueous solution in which sodium permanganate and lanthanum nitrate were dissolved will be indicated (see Tables 1 and 2). Note that the polishing conditions were the same as the above-described polishing conditions except that the pressure on the compound semiconductor substrate 11 from the polishing pad 20 was set to 40.0 kPa. In addition, while the polishing time for the Si surface was 620 s as described above, the polishing time for the C surface was set to 140 s. Table 1 indicates the polishing rate for the Si surface according to each of concentrations of sodium permanganate and lanthanum nitrate in the polishing liquid 1.

TABLE 1

| NaMnO$_4$ (wt %) | La(NO$_3$)$_3$ (wt %) | Polishing rate Si surface (μm/h) |
|---|---|---|
| 0.60 | 0.30 | 7.50 |
| 0.80 | 0.40 | 7.91 |
| 1.20 | 0.60 | 8.44 |
| 2.40 | 1.20 | 9.26 |
| 4.80 | 2.40 | 11.05 |

Table 2 indicates the polishing rate for the C surface according to sodium permanganate and lanthanum nitrate in the polishing liquid 1.

TABLE 2

| NaMnO$_4$ (wt %) | La(NO$_3$)$_3$ (wt %) | Polishing rate C surface (μm/h) |
|---|---|---|
| 0.60 | 0.30 | 26.68 |
| 0.80 | 0.40 | 28.64 |
| 1.20 | 0.60 | 30.44 |
| 2.40 | 1.20 | 33.58 |
| 4.80 | 2.40 | 37.94 |

As is clear from Tables 1 and 2, when the concentration of sodium permanganate is set to be equal to or more than 0.60 wt % and the concentration of lanthanum nitrate is set to be equal to or more than 0.30 wt %, the target polishing rate of 7.00 μm/h can be achieved, even in the case of polishing the Si surface which is said to be comparatively difficult to polish. In addition, when the concentration of sodium permanganate is set to be equal to or less than 4.80 wt % and the concentration of lanthanum nitrate is set to be equal to or less than 2.40 wt %, a sufficient polishing rate can be obtained while restraining an increase in the material cost of the polishing liquid 1.

As described above, the structures, methods, and the like according to the above-described embodiment can appropriately be modified in carrying out the present invention as long as the modifications do not depart from the scope of the object of the invention. For example, the water-soluble compound used in the polishing liquid 1 is not limited to lanthanum nitrate. It is rationally presumable that, even in the case of using yttrium nitrate, cerium nitrate, and zirconyl nitrate, a higher polishing rate can be realized as compared to the case of using ammonium cerium nitrate, owing to a mechanism similar to the above-mentioned mechanism.

Similarly, it is rationally presumable that, even in the case of using yttrium chloride, lanthanum chloride, cerium chloride, and zirconyl chloride and in the case of using yttrium sulfate, lanthanum sulfate, cerium sulfate, and zirconyl sulfate, a higher polishing rate can be realized as compared to the case of using ammonium cerium nitrate. Hence, transition metal elements in different Groups may be used in combination in the polishing liquid 1. For example, two or more of yttrium nitrate, lanthanum nitrate, and zirconyl nitrate may be used in appropriate combination in the polishing liquid 1. In other words, it is sufficient that the transition metal elements used in the polishing liquid 1 may include at least one element of Group III elements, lanthanoid, or Group IV elements.

In addition, a water-soluble compound of nitric acid and a transition metal element including at least one element of Group III elements, lanthanoid, or Group IV elements (in other words, a nitric acid-containing water-soluble compound) and a water-soluble compound of sulfuric acid and a transition metal element including at least one element of Group III elements, lanthanoid, or Group IV elements (in other words, a sulfuric acid-containing water-soluble compound) may be used in combination in the polishing liquid 1. Incidentally, in the polishing step S20, the polishing liquid 1 may be supplied from the polishing pad 20 to the compound semiconductor substrate 11, by spraying up the polishing liquid 1 to that region on the lower surface side of the polishing pad 20 which is out of contact with the compound semiconductor substrate 11 from a spray nozzle disposed on the outside in the radial direction of the chuck table, in place of the supply of the polishing liquid 1 through the through-hole 22.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A polishing method for a compound semiconductor substrate for polishing the compound semiconductor substrate, comprising:

a holding step of holding the compound semiconductor substrate by a chuck table of a polishing apparatus; and a polishing step of polishing the compound semiconductor substrate while supplying a polishing liquid from a polishing pad to the compound semiconductor substrate in a state in which the polishing pad is brought into contact with one surface of the compound semiconductor substrate, wherein:

the polishing pad is a fixed abrasive grain polishing pad having abrasive grains fixed in a main body of the polishing pad, the polishing liquid includes an aqueous solution in which a sodium permanganate and a water-soluble compound obtained by combination of a strong acid and a transition metal element are dissolved, the transition metal element includes at least one element of Group III elements, lanthanoid, or Group IV elements, concentrations of ammonium ions and ammonia contained in the aqueous solution are equal to or less than concentrations of the Group III elements, the lanthanoid, and the Group IV elements, a concentration of the sodium permanganate is equal to or less than 4.8 wt %, and free abrasive grains are not contained in the polishing liquid during the polishing step.

2. The polishing method according to claim 1, wherein a concentration of the water-soluble compound is equal to or less than 2.4 wt %.

3. The polishing method according to claim 2, wherein the concentration of the sodium permanganate is equal to or more than 0.6 wt %, and the concentration of the water-soluble compound is equal to or more than 0.3 wt %.

4. The polishing method according to claim 3, wherein the concentration of the sodium permanganate is equal to 0.8 wt %.

5. The polishing method according to claim 3, wherein the concentration of the sodium permanganate is equal to 1.2 wt %.

6. The polishing method according to claim 3, wherein the concentration of the sodium permanganate is equal to 2.4 wt %.

7. The polishing method according to claim 3, wherein the water-soluble compound includes lanthanum nitrate.

8. The polishing method according to claim 2, wherein the concentration of the sodium permanganate is twice as large as a concentration of the water-soluble compound.

9. The polishing method according to claim 2, wherein the water-soluble compound includes lanthanum nitrate.

* * * * *